United States Patent
Lin et al.

[11] Patent Number: 5,913,119
[45] Date of Patent: Jun. 15, 1999

[54] METHOD OF SELECTIVE GROWTH OF A HEMISPHERICAL GRAIN SILICON LAYER ON THE OUTER SIDES OF A CROWN SHAPED DRAM CAPACITOR STRUCTURE

[76] Inventors: Dahcheng Lin; Jung-Ho Chang; Hsi-Chuan Chen, all of 123 Park Ave. 3, Science-Based Industrial Park, Hsinchu, Taiwan

[21] Appl. No.: 09/105,384

[22] Filed: Jun. 26, 1998

[51] Int. Cl.[6] ............................................. H01L 21/8242
[52] U.S. Cl. ........................ 438/255; 438/396; 438/398; 438/253
[58] Field of Search .................................. 438/255, 253, 438/396, 398; 148/DIG. 14; 257/68, 71

[56] References Cited

U.S. PATENT DOCUMENTS

| | | | |
|---|---|---|---|
| 5,266,514 | 11/1993 | Tuan et al. | 437/52 |
| 5,338,700 | 8/1994 | Dennison et al. | 438/396 |
| 5,563,089 | 10/1996 | Jost et al. | 438/396 |
| 5,597,754 | 1/1997 | Lou et al. | 437/52 |
| 5,634,974 | 6/1997 | Weimer et al. | 117/103 |
| 5,639,685 | 6/1997 | Zahurak et al. | 437/60 |
| 5,656,531 | 8/1997 | Thakur et al. | 438/398 |
| 5,716,883 | 2/1998 | Tseng | 438/253 |
| 5,849,624 | 12/1998 | Fazan et al. | 438/398 |

*Primary Examiner*—Tuan H. Nguyen

[57] ABSTRACT

A process creating a crown shaped storage node electrode, for high density, DRAM designs, has been developed. The process features the formation of an hemispherical grain, (HSG), silicon layer, only on the outside walls of the amorphous silicon vertical shapes, of the crown shaped storage node electrode. The HSG silicon layer is formed from HSG silicon seeds, and from undoped, or lightly doped amorphous silicon layers, or a combination of both. The amorphous silicon vertical shapes are comprised of an undoped, or lightly doped amorphous silicon layer, placed as the outside layer, while a heavily doped amorphous silicon layer is used for the inside layer. This configuration therefore only allows the formation of the HSG silicon layer on the outside walls of the amorphous silicon vertical shape, and therefore results in a crown shaped storage node electrode, with a minimum space between vertical shapes maintained, and not compromised by encroaching HSG silicon layers, that would have been formed on the inside surfaces of the vertical shapes, if a heavily doped amorphous silicon layer were not present.

23 Claims, 5 Drawing Sheets

METHOD OF SELECTIVE GROWTH OF A HEMISPHERICAL GRAIN SILICON LAYER ON THE OUTER SIDES OF A CROWN SHAPED DRAM CAPACITOR STRUCTURE

BACKGROUND OF THE INVENTION

1. Field of the Invention

The present invention relates to a method used to fabricate high density, semiconductor, DRAM cells, with stacked capacitor structures, and more specifically to a fabrication process used to increase the surface area of a storage node electrode, used in the stacked capacitor structure.

2. Description of the Prior Art

Device performance and cost reductions are the major objectives of the semiconductor industry. These objectives have been in part realized by the ability of the semiconductor industry to produce chips with sub-micron features, or micro-miniaturization. Smaller features allow the reduction in performance degrading capacitances and resistances to be realized. In addition smaller features result in a smaller chip, however still possessing the same level of integration obtained for semiconductor chips fabricated with larger features. This allows a greater number of the denser, smaller chips to be obtained from a specific size starting substrate, thus resulting in a lower manufacturing cost for an individual chip.

The use of smaller features, when used for the fabrication of dynamic random access memory, (DRAM), devices, in which the capacitor of the DRAM device is a stacked capacitor, (STC), structure, presents difficulties when attempting to increase STC capacitance. A DRAM cell is usually comprised of the STC structure, overlying a transfer gate transistor, and connected to the source of a source/drain of the transfer gate transistor. However the decreasing size of the transfer gate transistor, limits the dimensions of the STC structure. To increase the capacitance of the STC structure, comprised of two electrodes, separated by a dielectric layer, either the thickness of the dielectric layer has to be decreased, or the area of the capacitor has to be increased. The reduction in dielectric thickness is limited by increasing reliability and yield risks, encountered with ultra thin dielectric layers. In addition the area of the STC structure is limited by the area of the underlying transfer gate transistor dimensions. The advancement of the DRAM technology to densities of 256 million cells per chip, or greater, has resulted in a specific cell in which a smaller transfer gate transistor is being used, resulting in less of an overlying area for placement of overlying STC structures.

Two methods that can be used to increase STC capacitance, while still decreasing the lateral dimension of the capacitor, are the use of rough, or hemispherical grain (HSG), silicon layers, and the use of crown shaped STC structures. First, referring to the crown shaped STC structures, the creation of a polysilicon, or amorphous silicon, storage node electrode structure, comprised of both vertical and horizontal silicon features, results in a greater electrode surface area then would have been achieved with counterparts fabricated without vertical features. Secondly the use of an HSG silicon layer, comprised of convex and concave features, and used for the top layer of the storage node electrode structure, again results in a greater degree of surface area then counterparts fabricated with smooth silicon layers. Therefore the combination of a crown shaped STC structure, comprised with a top layer of HSG silicon, residing on the crown shaped storage node structure, is an attractive option for high density DRAM devices. However if a HSG silicon layer is used with a crown shaped storage node electrode, the space between the vertical features, of the crown shaped structure, has to be increased to accept the growth of the HSG silicon layer, on the inside walls of the vertical features. If this space were kept at a minimum, HSG silicon, residing on neighboring inside walls of the vertical features, may intersect, leaving little, or no space remaining for the capacitor dielectric layer, thus negating the advantage of increased surface area using the combination of HSG silicon and the crown shaped structures. If the space between vertical features, of the crown shaped structure, were increased to accept the additional growth of the HSG silicon layer, on the inside walls of the crown shaped storage node electrode, the final dimension of the DRAM capacitor structure may violate design groundrules.

This invention will describe a novel process for the fabrication of a crown shaped STC structure, however incorporating a selective growth of an HSG silicon layer, to occur only on the outside walls of the vertical features of the crown shaped STC structure. The selective growth of the HSG silicon layer, only on the outside walls of the vertical features, of the crown shaped STC, thus allows the minimum space between vertical features to still be maintained, and thus also allows a minimum lateral dimension for the DRAM capacitor structure, to be achieved. Prior art, such as Tseng, in U.S. Pat. No. 5,716,883, describes a fabrication method for a crown shaped STC structure, while Lou, et al, in U.S. Pat. No. 5,597,754, describe a method for forming an HSG silicon layer, for a DRAM storage node structure. However none of the prior art describe the process used in the present invention, in which selective growth of an HSG silicon layer, is achieved only on the outside walls. of vertical features, of a crown shaped STC structure.

SUMMARY OF THE INVENTION

It is an object of this invention to create a DRAM capacitor structure, in which the surface area the storage node electrode, of the DRAM capacitor structure is increased, without increasing the lateral dimension of the DRAM capacitor structure.

It is another object of this invention to use a crown shaped stacked capacitor structure, (STC), for DRAM devices, via the fabrication of a crown shaped storage node electrode, in which the crown shaped storage node electrode is comprised of both amorphous silicon horizontal and amorphous silicon vertical features.

It is yet another object of this invention to form the amorphous silicon vertical features, of the crown shaped storage node electrode, using a composite amorphous silicon layer, in which an undoped, or lightly doped silicon layer is used for the outside walls of the amorphous silicon vertical shapes, while a heavily doped amorphous silicon layer is used for the inside walls of the amorphous silicon vertical features.

It is still yet another object of this invention to selectively grow an HSG silicon layer, only on undoped, or lightly doped silicon layer, or only on the outside walls, of the amorphous silicon vertical features, of the crown shaped storage node electrode.

In accordance with the present invention a method for fabricating a DRAM device, with increased capacitance realized via the use of crown shaped storage node electrode, comprised using an HSG silicon layer on the outside walls of the amorphous silicon vertical features of the crown shaped storage node electrode, has been developed. A transfer gate transistor comprised of: a thin gate insulator; a polysilicon gate structure; a lightly doped source/drain region; insulator spacers on the sidewalls of the polysilicon gate structure; and a heavily doped source/drain regions; are formed on a semiconductor substrate. A composite insulator layer is deposited on the transfer gate transistor region, followed by the creation of a storage node contact hole, in the composite insulator layer, exposing a source region, of the transfer gate transistor. A doped polysilicon plug is formed in the storage node contact hole, contacting the source region of the transfer gate transistor. Two insulator shapes are formed on the top surface of the underlying composite insulator layer, with the top surface of the doped polysilicon plug, exposed between insulator shapes. A series of amorphous silicon layers are next deposited, coating the walls of the insulator shapes, and in the space between insulator shapes. The series of amorphous silicon layers consist of an underlying, first undoped amorphous silicon layer, a lightly doped silicon layer, a second undoped amorphous silicon layer, and an overlying, heavily doped amorphous silicon layer. A chemical mechanical polishing procedure is used to remove the series of amorphous silicon layers, from the top surface of the two insulator shapes, exposing the top surface of the insulator shapes. Selective removal of the two insulator shapes, results in a crown shaped storage node shape, comprised of two vertical features of amorphous silicon layers, formerly on the sides of the insulator spaces, connected to a horizontal feature of amorphous silicon layers, with the horizontal feature of amorphous silicon layers, overlying and contacting the doped polysilicon plug, in the storage node contact hole. The outside walls, of the amorphous silicon vertical features, expose the first undoped amorphous silicon layer, while the inside walls, of the amorphous silicon vertical features, expose the heavily doped amorphous silicon layer. Hemispherical grain, (HSG), silicon seeds are next formed on all surfaces of the crown shaped storage node shape, followed by an anneal procedure that results in the formation of an HSG silicon layer, only in regions in which the HSG silicon seeds overlaid the first undoped, or lightly doped amorphous silicon layer, or only on the outside walls, of the amorphous silicon vertical features. A second anneal is then used to crystallize all the amorphous layers, to increase the dopant level in the HSG silicon layer, due to the dopant diffusion from the heavily doped to the undoped/lightly doped layer, resulting in a crown shaped storage node electrode, comprised of doped silicon vertical features, and doped silicon horizontal features, with a doped HSG silicon layer located only on the outside walls of the vertical features, and with the doped silicon horizontal feature contacting the doped polysilicon plug. A capacitor dielectric layer is formed on the surface of the crown shaped storage node electrode, followed by the creation of an upper polysilicon electrode, completing the formation of a crown shaped, stacked capacitor structure.

BRIEF DESCRIPTION OF THE DRAWINGS

The object and other advantages of this invention are best explained in the preferred embodiment with reference to the attached drawings that include.

DESCRIPTION OF THE PREFERRED EMBODIMENTS

The method of forming a crown shaped storage node electrode, used as the bottom electrode of DRAM capacitor structure, and with an HSG silicon layer selectively formed on the outside walls, of the vertical features of a crown shaped storage node shape, will now be described. The transfer gate transistor, used for the DRAM device, of this invention, will be an N channel device. However this invention, using an HSG silicon layer on selective regions of a crown shaped storage node shape, used to increase the surface area of the DRAM capacitor, can also be applied to P channel, transfer gate transistor. In addition doped, and undoped, polysilicon layers, can be used in place of the doped, and undoped, amorphous silicon layers, for creation of the crown shaped storage node electrode.

Figure 1:
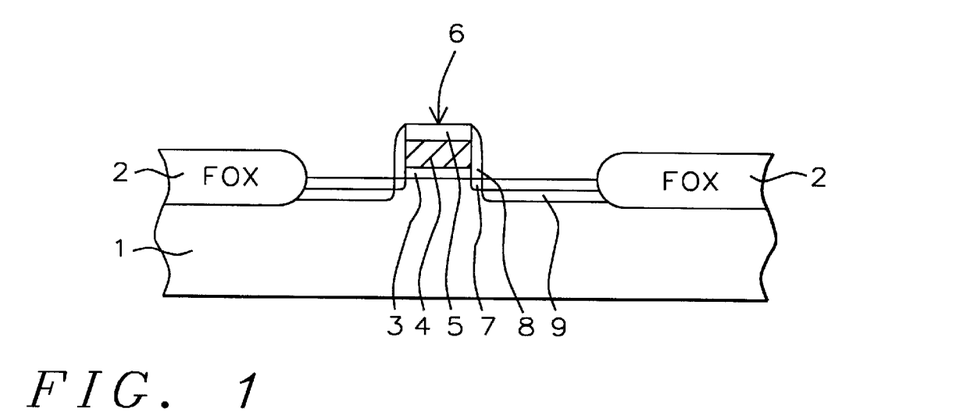
FIGS. 1–11, which schematically, in cross-sectional style, shows the key fabrication stages used in the creation of a crown shaped storage node electrode, used as part of a DRAM, stacked capacitor structure, and with a HSG silicon layer located on the outside walls, of the amorphous silicon vertical features, of the crown shaped storage node electrode.

Referring to FIG. 1, a P type, semiconductor substrate 1, with a <100>, single crystalline orientation, is used. Field oxide, (FOX), regions 2, are used for purposes of isolation. Briefly the FOX regions 2, are formed via thermal oxidation, in an oxygen-steam ambient, at a temperature between about 750 to 1050° C., to a thickness between about 2000 to 5000 Angstroms. A patterned oxidation resistant mask of silicon nitride-silicon oxide is used to prevent FOX regions 2, from growing on areas of semiconductor substrate 1, to be used for subsequent device regions. After the growth of the FOX regions 2, the oxidation resistant mask is removed via use of a hot phosphoric acid solution for the overlying, silicon nitride layer, and a buffered hydrofluoric acid solution for the underlying silicon oxide layer. If desired, FOX regions 2, can be replaced by insulator filled shallow trenches. This can be accomplished via forming a trench, between about 2000 to 5000 Angstroms in depth, in semiconductor substrate 1, using anisotropic reactive ion etching, (RIE), procedure, using $Cl_2$ as an etchant. A silicon oxide layer, obtained using a low pressure chemical vapor deposition, (LPCVD), or a plasma enhanced chemical vapor deposition, (PECVD), procedure, is used to completely fill the shallow trenches. Unwanted silicon oxide is removed via a anisotropic RIE procedure, or via a chemical mechanical polishing, (CMP), procedure.

After a series of wet cleans, a gate insulator layer 3, comprised of silicon dioxide, is thermally grown in an oxygen-steam ambient, at a temperature between about 750 to 1050° C., to a thickness between about 40 to 200 Angstroms. A first polysilicon layer 4, is next deposited using LPCVD procedures, at a temperature between about 500 to 700° C., to a thickness between about 500 to 4000 Angstroms. The polysilicon layer can either be grown intrinsically and doped via ion implantation of arsenic or phosphorous, or polysilicon layer 4, can be in situ doped during deposition via the incorporation of either arsine or phosphine to the silane, or disilane ambient. If lower word line, or gate resistance is desired, polysilicon layer 4, can be replaced by a polycide layer, comprised of a metal silicide layer, such as tungsten silicide or titanium silicide, residing on an underlying doped polysilicon layer. A silicon oxide layer 5, used as a cap insulator layer, is next grown via LPCVD or PECVD procedures, to a thickness between about 600 to 2000 Angstroms. Conventional photolithographic and reactive ion etching, (RIE), procedures, using $CHF_3$ as an etchant for silicon oxide layer 5, and using $Cl_2$ as an etchant for polysilicon or polycide layer 4, are used to create gate structure 6, with overlying cap insulator layer 5, shown schematically in FIG. 1. Photoresist removal is accomplished via plasma oxygen ashing and careful wet cleans.

A lightly doped source/drain region 7, is next formed via ion implantation of phosphorous, at an energy between about 5 to 60 KeV, at a dose between about 1E13 to 1E15 atoms/$cm^2$, Another silicon oxide layer is then deposited, using either LPCVD or PECVD procedures, at a temperature between about 400 to 850° C., to a thickness between about 1500 to 4000 Angstroms, followed by an anisotropic RIE procedure, using $CHF_3$ as an etchant, creating insulator spacers 8, located on the sides of gate structure 6. A heavily doped source/drain region 9, is then formed via ion implantation of arsenic, at an energy between about 30 to 100 KeV, at a dose between about 1E14 to 5E16 atoms/cm². The result of these procedures are again schematically shown in FIG. 1.

Figure 2:
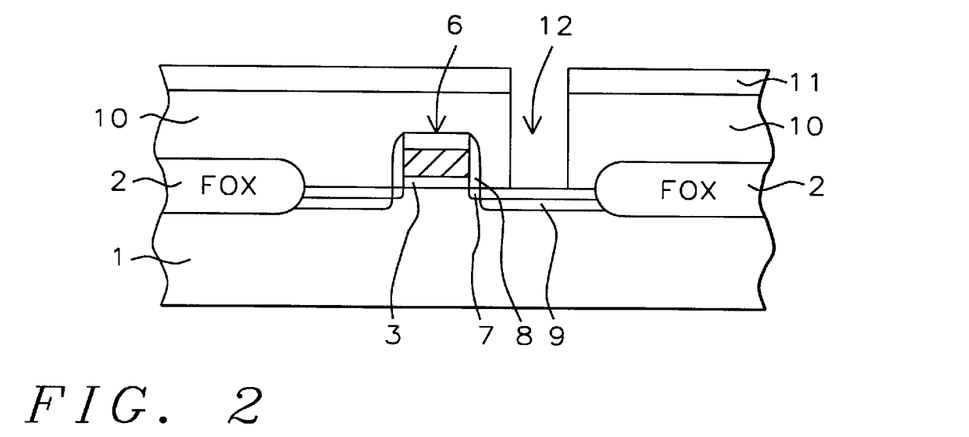

An insulator layer 10, of either silicon oxide, or borophosphosilicate glass, (BPSG), is next deposited via LPCVD or PECVD procedures, to a thickness between about 1000 to 5000 Angstroms. A chemical mechanical polishing, (CMP), procedure is next used to planarize insulator layer 10. If a BPSG layer is used, a reflow procedure, performed at a temperature between about 700 to 1000° C., is employed to create a smoother the top surface topography for the BPSG layer. A silicon nitride layer 11, is next deposited, via LPCVD or PECVD procedures, to a thickness between about 50 to 1000 Angstroms. Conventional photolithographic and RIE procedures, using $CF_4$ as an etchant for silicon nitride layer 11, and using $CHF_3$ as an etchant for silicon oxide layer 10, are used to open storage node contact hole 12, in the composite insulator layer, exposing the top surface of heavily doped source/drain region 9. This is schematically shown in FIG. 2. Removal of the photoresist shape, used as an etch mask for the creation of storage node contact hole 12, is performed via use of plasma oxygen ashing and careful wet cleans.

Figure 3:
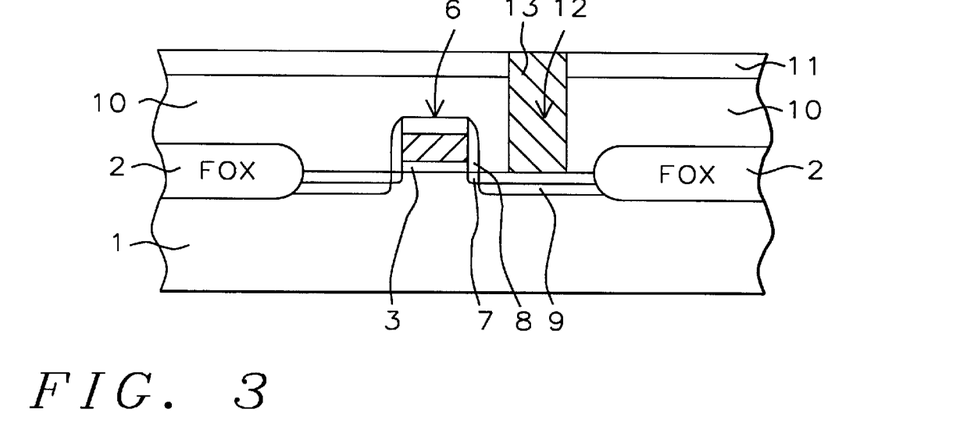

A polysilicon layer is next deposited, using LPCVD procedures, at a thickness between about 1000 to 6000 Angstroms. The polysilicon layer is in situ doped, during deposition, via the addition of arsine, or phosphine, to a silane, or disilane ambient, resulting in a bulk concentration for the polysilicon layer, between about 1E19 to 2E20 atoms/cm³. The formation of doped polysilicon plug 13, in storage node contact hole 12, shown schematically in FIG. 3, is accomplished via removal of unwanted polysilicon, from the top surface of silicon nitride layer 11, using either an anisotropic RIE procedure, using $Cl_2$ as an etchant, or using a CMP procedure.

Figure 4:
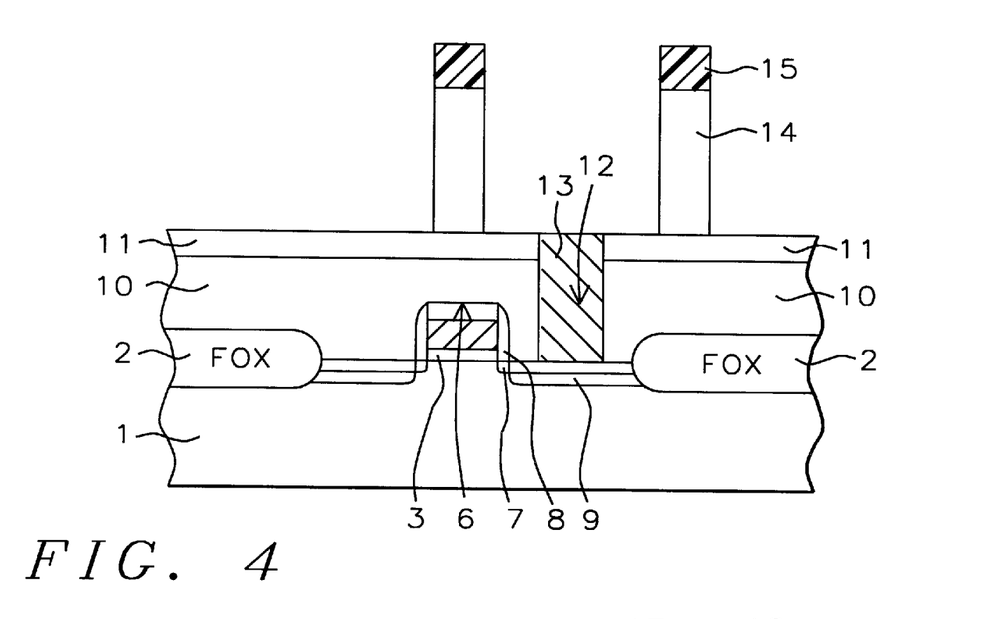

FIG. 4, schematically shows the formation of two insulator shapes, that will be used to form a subsequent crown shaped storage node electrode. A thick silicon oxide layer is deposited using LPCVD or PECVD procedures, to a thickness between about 4000 to 20000 Angstroms. Photoresist shapes 15, are next formed on the top surface of the thick silicon oxide layer, and used as a mask to allow an anisotropic RIE procedure, using $CHF_3$ as an etchant, to pattern the thick silicon oxide layer, creating thick silicon oxide shapes 14, schematically shown in FIG. 4. The height, or thickness, of thick silicon oxide shapes 14, will subsequently determine the height of the amorphous silicon vertical features, used as a component of a crown shaped storage node electrode.

Figure 5:
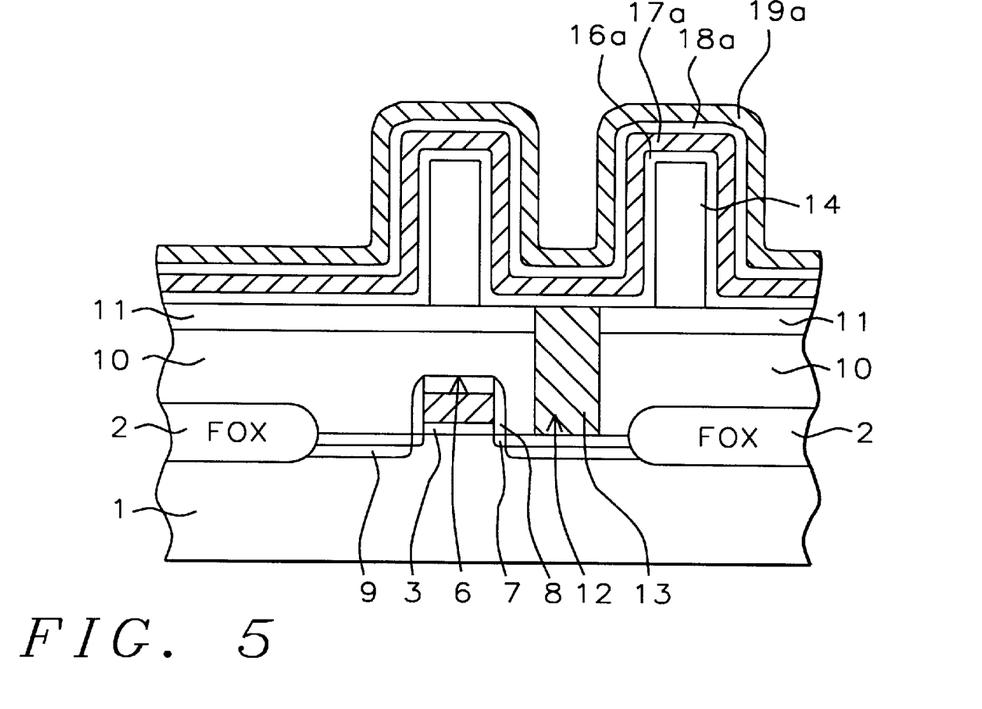

After removal of photoresist shapes 15, via plasma oxygen ashing and careful wet cleans, a series of amorphous silicon layers are deposited, and shown schematically in FIG. 5. A first, undoped amorphous silicon layer 16a, is deposited using LPCVD procedures, at a temperature below 550° C., to a thickness less than 200 Angstroms, using silane, or disilane as a source. Next a lightly doped amorphous silicon layer 17a, is in situ deposited in the same LPCVD furnace used for the first, undoped amorphous silicon layer 16a, Lightly doped amorphous silicon layer 17a, is deposited at a temperature below 550° C., to a thickness less than 400 Angstroms, and in situ doped, during deposition, via the addition of phosphine to a silane, or to a disilane, ambient, resulting in a bulk concentration, for lightly doped amorphous silicon layer 17a, between about 1E19 to 4E20 atoms/cm³. A second, undoped amorphous silicon layer 18a, is then deposited, again in situ in the LPCVD furnace, at a temperature below 550° C., to a thickness less than 200 Angstroms, using a silane or a disilane source. Finally heavily doped amorphous silicon layer 19a, is deposited in situ in the LPCVD furnace, at a temperature below 550° C., to a thickness between about 100 to 1000 Angstroms, and doped in situ, during deposition, via the addition of phosphine to a silane, or to a disilane ambient, resulting in a bulk concentration, for heavily doped amorphous silicon layer 19a, greater than 4E20 atoms/cm³.

Figure 6:
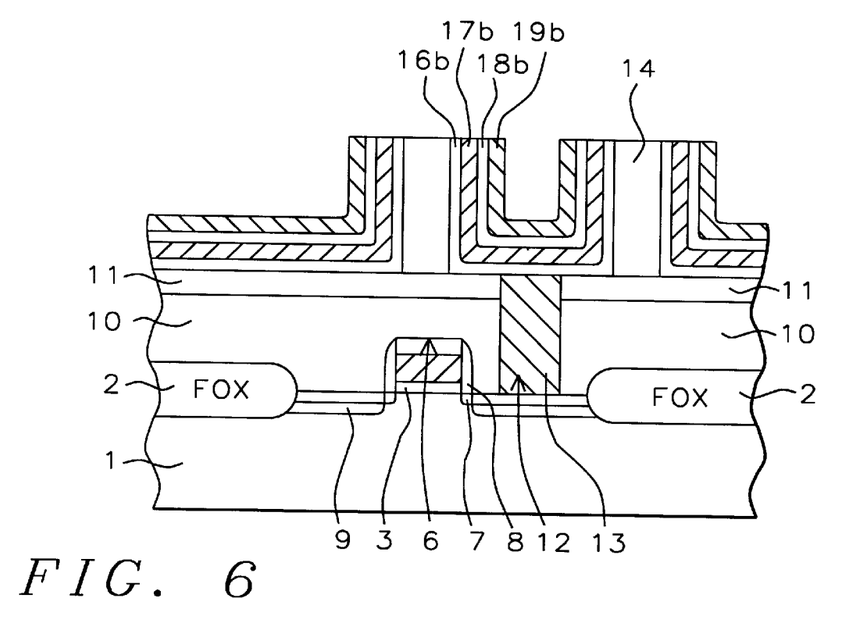
Figure 7:
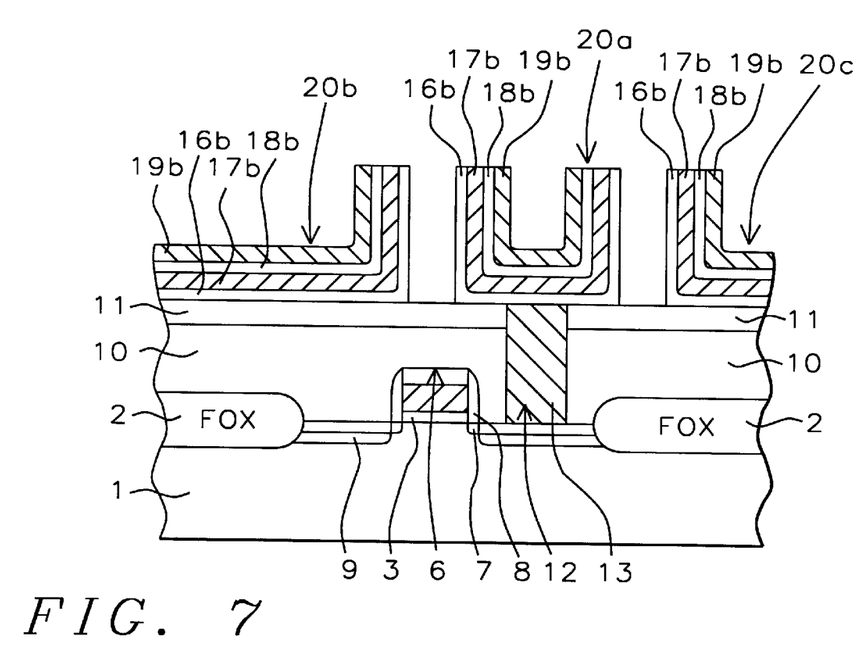

A chemical mechanical polishing, (CMP), procedure is then employed, removing the composite, amorphous silicon layers, residing on the top surface of thick silicon oxide shapes 14, resulting in the creation of discontinuous layers of: first undoped amorphous silicon layer 16b; lightly doped amorphous silicon layer 17b; second undoped amorphous silicon layer 18b; and heavily doped amorphous silicon layer 19b. This is schematically represented in FIG. 6. The CMP procedure exposes the top surface of thick silicon oxide shapes 14. An etch procedure, using a buffered hydrofluoric acid solution, or using hydrofluoric gas with/without water vapor, is next used to selectively remove thick silicon oxide shapes 14, resulting in crown shape storage node shape 20a, comprised of two amorphous silicon vertical features, connected by an amorphous silicon horizontal feature. The horizontal feature, of crown shaped storage node shape 20a, overlays and contacts, doped polysilicon plug 13, located in storage node contact hole 12. This is schematically shown in FIG. 7. Of importance is the outer layers of crown shaped storage node shape 20a, are the first undoped amorphous silicon layers 16b, while the inner layers of crown shaped storage node shape 20a, are heavily doped amorphous silicon layers 19b, This configuration will be critical when subsequent, selective formation of an HSG silicon, only on the surface of first undoped amorphous silicon layers 16b, is attempted. Also shown in FIG. 7, are portions of additional crown shaped storage shapes 20b, and 20c, used with other underlying transfer gate transistors. For purposes of clarity, crown shaped storage node shape 20b, and 20c, will not be included in the final drawings.

Figure 8:
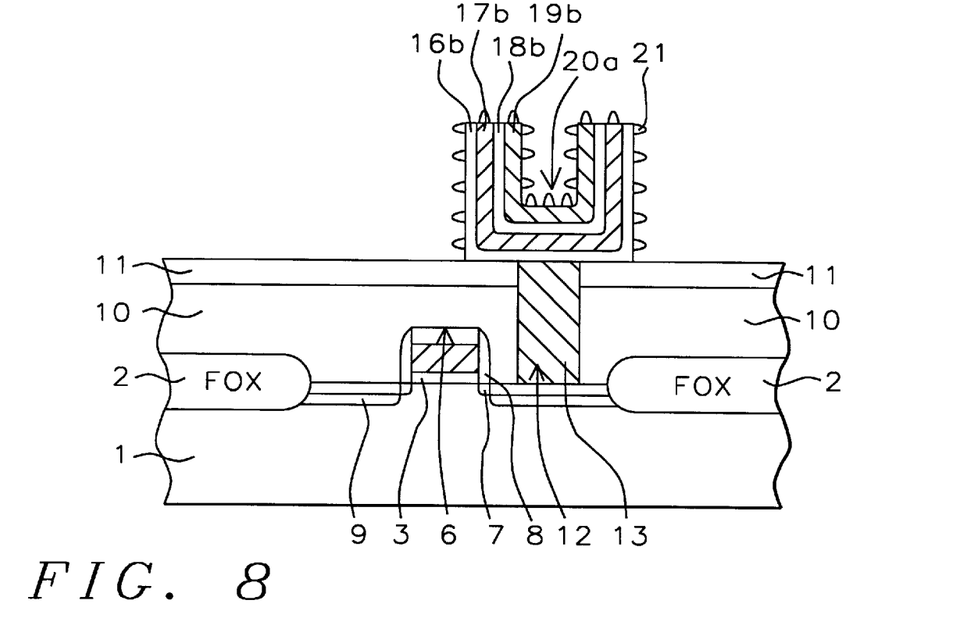
Figure 9:
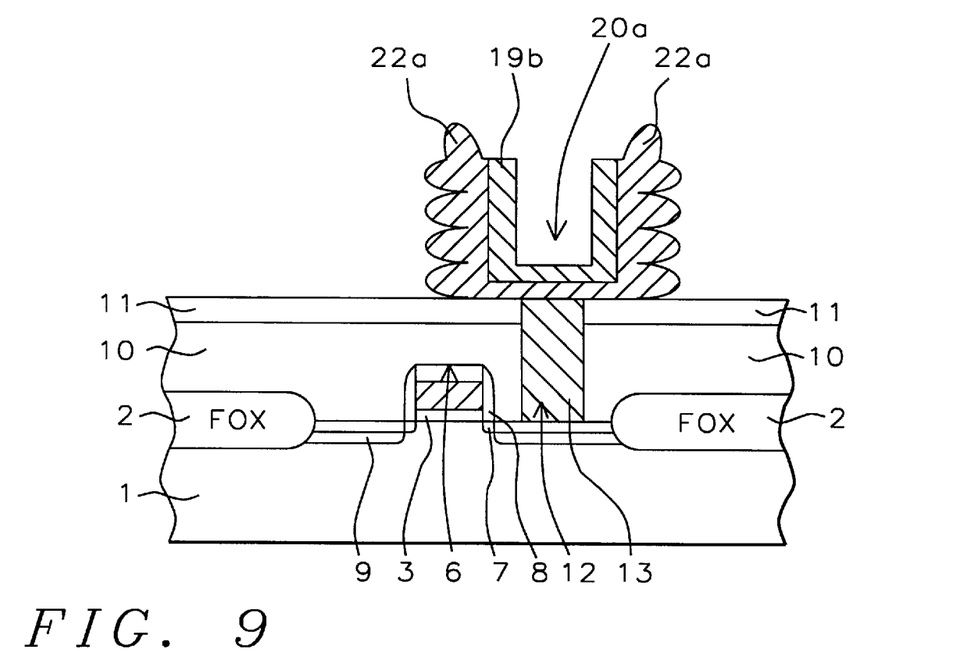

FIG. 8, schematically shows the result of growing HSG silicon seeds 21, on exposed surfaces of crown shaped storage node shape 20a, This is accomplished via LPCVD, or UHVCVD, (ultra high vacuum CVD), deposition of the HSG silicon seeds 21, at a temperature between about 550 to 800°, at a pressure below 1.0 torr, for a time between about 10 sec to 120 min., and using a silane, or a disilane flow concentration below 1.00E-3 moles/m³. A critical first anneal cycle is next performed, resulting in the formation of HSG silicon layer 22a, in regions in which HSG silicon seeds resided on first undoped amorphous silicon layer 16b, This selective growth, shown schematically in FIG. 9, did not occur in regions in which HSG silicon seeds overlaid heavily doped amorphous silicon layer 19b, The first anneal cycle, performed at a temperature between about 550 to 800° C., at a pressure below 1.0 torr, for a time between about 0 to 120 min, in a nitrogen ambient, forms HSG silicon layer 22a, via consumption of HSG silicon seeds 21, and of consumption of undoped/lightly doped/undoped amorphous silicon layers 16b, 17b and 18b. The inability to form an HSG silicon layer, using HSG silicon seeds 21, on heavily doped amorphous silicon layer 19b, resulted in the space between the amorphous silicon vertical features, of the crown shaped storage node shape, remaining at the designed dimension. If an HSG silicon layer were formed on the inside walls of the vertical features, of the crown shaped storage node shape, the space between the vertical features may have disappeared. The HSG silicon seeds 21, on heavily doped amorphous silicon layer 19b, were consumed by heavily doped amorphous silicon layer 22a, during the first anneal cycle.

Figure 10:
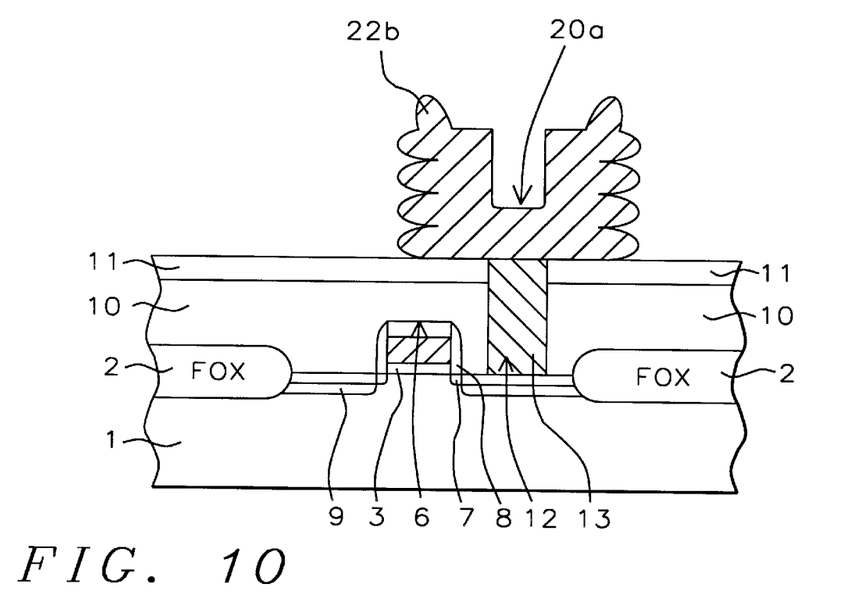

A second anneal cycle, performed at a temperature between about 800 to 850° C., for a time between about 20 to 40 min., in a nitrogen ambient, allows the HSG silicon layer 22a, to be doped via diffusion from heavily doped amorphous silicon layer 19b, creating highly doped HSG silicon layer 22b, schematically shown in FIG. 10. The second anneal procedure also induces the crystallization of all amorphous layers, resulting in the stabilization of the HSG layer for the subsequent capacitor dielectric layer deposition.

Figure 11:
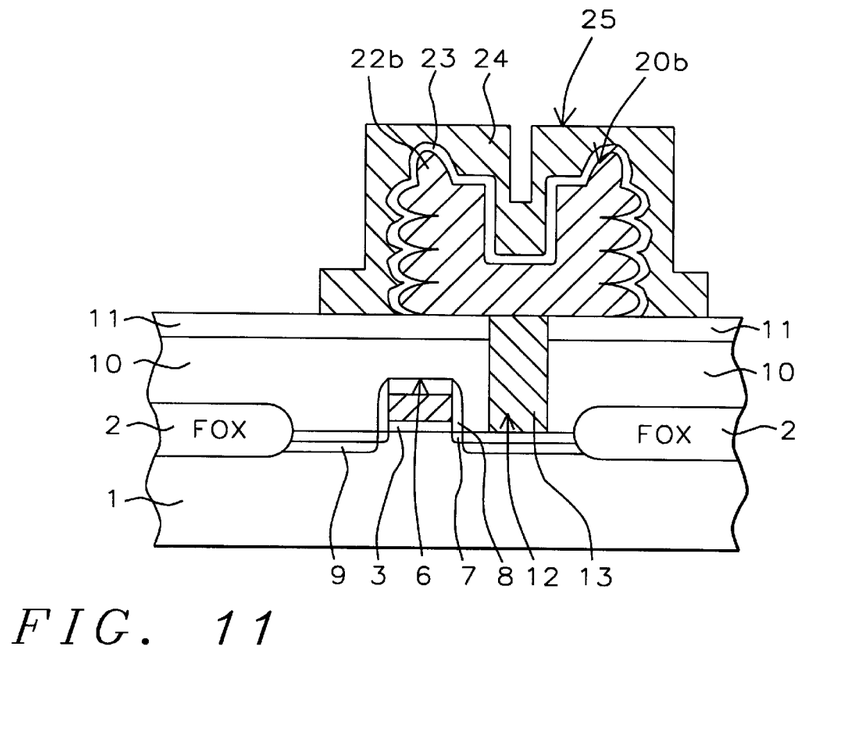

A capacitor dielectric layer 23, such as ONO, (Oxidized—silicon Nitride—silicon Oxide), is next formed on crown shaped storage node electrode 20b, The ONO layer is formed by initially growing a silicon dioxide layer, between about 10 to 50 Angstroms, followed by the deposition of a silicon nitride layer, between about 10 to 60 Angstroms. Subsequent thermal oxidation of the silicon nitride layer results in the formation of a silicon oxynitride layer on silicon oxide, at a silicon oxide equivalent thickness of between about 40 to 80 Angstroms. Finally another layer of polysilicon is deposited, via LPCVD procedures, to a thickness between about 1000 to 2000 Angstroms. Doping of this polysilicon layer is accomplished using the situ doping, deposition procedure, via the addition of phosphine to a silane, or disilane ambient. Photolithographic and RIE procedures, using $Cl_2$ as an etchant, are next employed to create polysilicon upper electrode, or plate electrode 24, shown schematically in FIG. 11. Photoresist is again removed via plasma oxygen ashing and careful wet cleans.

While this invention has been particularly shown and described with reference to the preferred embodiments thereof, it will be understood by those skilled in the art that various changes in form and details may be made without departing from the spirit and scope of this invention.

What is claimed is:

1. A method of fabricating a capacitor structure, for a dynamic random access memory, (DRAM), device, on a semiconductor substrate, comprised the steps of:

providing an underlying transfer gate transistor, comprised of a gate structure, on a gate insulator layer, insulator spacers on the sides of said gate structure, and a source/drain region in an area of said semiconductor substrate, not covered by said gate structure;

forming a storage node contact hole, in a composite insulator layer, exposing the top surface of a source region;

forming a doped polysilicon plug, in said storage node contact hole;

forming insulator shapes on the top surface of said composite insulator layer, with said doped polysilicon plug located between said insulator shapes;

depositing a composite layer of amorphous silicon layers, comprised of: an underlying, first undoped amorphous silicon layer; a lightly doped amorphous silicon layer; a second undoped amorphous silicon layer; and an overlying, heavily doped amorphous silicon layer; with deposition occurring on the sides of said insulator shapes, and with deposition occurring on the region between said insulator shapes, comprised of a portion of the top surface of said composite insulator layer, and comprised of the top surface of said doped polysilicon plug;

removing said composite layer of amorphous silicon layers from the top surface of said insulator shapes;

removing said insulator shapes, resulting in the formation of a crown shaped storage node shape, comprised of amorphous silicon vertical shapes, and an amorphous silicon horizontal shape, with said amorphous silicon horizontal shape, connected to, and located between, said amorphous silicon vertical shapes, and with said amorphous silicon horizontal shape overlying said doped polysilicon plug;

depositing hemispherical grain, (HSG), silicon seeds, on the surfaces of said crown shaped storage node shape;

performing a first anneal cycle, to form an HSG silicon layer, on the outside walls of said amorphous silicon vertical shapes, via reaction between said HSG silicon seeds, and exposed, said undoped/lightly doped/undoped amorphous silicon layers, while the inside walls of said amorphous silicon vertical shapes, and the top surface of said amorphous silicon horizontal shape, comprised of a top layer of said heavily doped amorphous silicon layer, remain unreacted;

performing a second anneal cycle, converting said HSG silicon layer to a highly doped HSG silicon layer, and forming a crown shaped storage node electrode, comprised of doped polysilicon vertical shapes, with said doped HSG silicon layer located on the outside walls of said doped amorphous silicon vertical shapes, and comprised of a doped polysilicon horizontal shape, located between, and connected to, said doped polysilicon vertical shapes, and overlying said doped polysilicon plug;

forming a capacitor dielectric layer on said crown shaped storage node electrode; and forming an upper plate electrode, for said capacitor structure.

2. The method of claim 1, wherein said doped polysilicon plug is formed from a polysilicon layer, obtained using LPCVD procedures, to a thickness between about 1000 to 6000 Angstroms, and in situ doped during deposition, via the addition of phosphine or arsine, to a silane, or disilane ambient, resulting in a bulk concentration for said doped polysilicon plug between about 1E19 to 2E20 atoms/cm$^3$.

3. The method of claim 1, wherein said insulator spacers are comprised of silicon oxide, obtained via LPCVD or PECVD procedures, to a thickness between about 4000 to 20000 Angstroms, and patterned via an anisotropic RIE procedure, using $CHF_3$ as an etchant.

4. The method of claim 1, wherein said composite layer of amorphous silicon layers is comprised of: underlying, said first undoped amorphous silicon layer, obtained using LPCVD procedures, to a thickness less than 200 Angstroms, using silane, or disilane, as a source; said lightly doped amorphous silicon layer, obtained using LPCVD procedures, to a thickness less than 400 Angstroms, and in situ doped during deposition via the addition of phosphine to a silane, or to a disilane ambient, resulting in a bulk concentration, for said lightly doped amorphous silicon layer, between about 1E19 to 4E20 atoms/cm$^3$; said second amorphous silicon layer, obtained using LPCVD procedures, to a thickness less than 200 Angstroms, using silane, or disilane, as a source; and said heavily doped amorphous silicon layer, obtained using LPCVD procedures, to a thickness between about 100 to 1000 Angstroms, and in situ doped during deposition via the addition of phosphine to a silane, or to a disilane ambient, resulting in a bulk concentration for said heavily doped amorphous silicon layer greater than 4E20 atoms/cm$^3$.

5. The method of claim 1, wherein said composite layer of amorphous silicon layers is removed from the top surface of said insulator shapes using a chemical mechanical polishing procedure.

6. The method of claim 1, wherein said insulator shapes are removed using an etchant, comprised of a buffered hydrofluoric acid solution, or a hydrofluoric gas with or without water vapor.

7. The method of claim 1, wherein said HSG silicon seeds are formed via an LPCVD, or a UHVCVD procedure, at a temperature between about 550 to 800° C., at a pressure below 1.0 torr, for a time between about 10 sec to 120 min., using a silane or a disilane flow concentration below 1.00E–3 moles/m$^3$.

8. The method of claim 1, wherein said first anneal cycle, used to form said HSG silicon layer, from said HSG silicon seeds, and from said undoped/lightly doped/undoped amorphous silicon layers, is performed at a temperature between about 550 to 800° C., at a pressure below 1.0 torr, and for a time between about 0 to 120 min.

9. The method of claim 1, wherein said second anneal cycle, used to convert said HSG silicon layer, to said highly doped HSG silicon layer, is performed at a temperature between about 800 to 850° C., for a time between about 20 to 60 min.

10. The method of claim 1, wherein said dielectric layer is ONO, at an equivalent silicon dioxide thickness between about 40 to 80 Angstroms, created by an initial thermal oxidation to form a silicon oxide layer, between about 10 to 50 Angstroms, followed by a deposition of silicon nitride, to a thickness between about 10 to 60 Angstroms, and thermal oxidation of said silicon nitride layer, creating a silicon oxynitride layer, on the underlying, said silicon oxide layer.

11. A method of fabricating a crown shaped storage node electrode, for a DRAM capacitor structure, on a semiconductor substrate, with a hemispherical grain, (HSG), silicon layer, on the outside walls of amorphous silicon vertical shapes, of the crown shaped storage node electrode, comprising the steps of:

providing a underlying transfer gate transistor, on said semiconductor substrate, comprised of a polysilicon gate structure, with insulator spacers on the sides of said polysilicon gate structure, overlying a silicon dioxide gate insulator layer, and a source/drain region, in an area of said semiconductor substrate, not covered by said gate structure;

depositing a composite insulator layer, comprised of an underlying silicon oxide layer, and an overlying silicon nitride layer;

forming a storage node contact hole in said composite insulator layer, exposing the top surface of the source region, of said source/drain region;

depositing a doped polysilicon layer, completely filling said storage node contact hole;

removing said doped polysilicon layer, from the top surface of said composite insulator layer, forming a doped polysilicon plug, in said storage node contact hole;

depositing a thick insulator layer;

forming two insulator shapes, from said thick insulator layer, on said composite insulator layer, with the top surface of said doped polysilicon plug, exposed in a region between said two insulator shapes;

depositing a first undoped amorphous silicon layer, on said two insulator shapes, and in the region between said two insulator shapes;

depositing a lightly doped amorphous silicon layer, on said first undoped amorphous silicon layer;

depositing a second undoped amorphous silicon layer, on said lightly doped amorphous silicon layer;

depositing a heavily doped amorphous silicon layer, on said second undoped amorphous silicon layer;

removing said heavily doped amorphous silicon layer, said second undoped amorphous silicon layer, said lightly doped amorphous silicon layer, and said first undoped amorphous silicon layer, from the top surface of the two insulator shapes;

removing said two insulator shapes, resulting in a crown shaped storage node shape, comprised of two amorphous silicon vertical shapes, with said first undoped amorphous silicon layers, located on the outside walls, and said heavily doped amorphous silicon layers, located on the inside walls, of the amorphous silicon vertical shapes, and with said crown shaped storage node shape also comprised of a amorphous silicon horizontal shape, located overlying the region between said two amorphous silicon vertical shapes, and connected to the inside walls of said two amorphous silicon vertical shapes, and with the top surface of said amorphous silicon horizontal shape being said heavily doped amorphous silicon layer;

depositing HSG silicon seeds on the surfaces of said crown shaped storage node shape;

performing a first anneal cycle, to form an HSG silicon layer, on the outside walls of the two amorphous silicon vertical shapes, via consumption of said HSG silicon seeds, and of said undoped/lightly doped/undoped amorphous silicon layers, while said HSG seeds, overlying said heavily doped amorphous silicon layers, located on the inside walls of the two amorphous silicon vertical shapes, and located on the said amorphous silicon horizontal shape, remains unreacted;

performing a second anneal cycle, used to convert said HSG silicon layer to a highly doped HSG silicon layer, and resulting in the formation of said crown shaped storage node electrode, comprised of two doped, polysilicon vertical shapes, featuring said doped HSG silicon layer, on the outside walls of the two doped, polysilicon vertical shapes, connected by a doped, polysilicon horizontal shape, overlying the region between the two doped, polysilicon vertical shapes;

forming a capacitor dielectric layer on said crown shaped storage node electrode;

depositing a polysilicon layer; and patterning of said polysilicon layer to form a polysilicon upper electrode, for said DRAM capacitor structure.

12. The method of claim 11, wherein said composite insulator layer is comprised of an underlying layer of either silicon oxide, or boro-phosphosilicate glass, obtained via LPCVD or PECVD procedures, at a thickness between about 1000 to 5000 Angstroms, and is comprised of an overlying layer of silicon nitride, obtained via LPCVD or PECVD procedures, to a thickness between about 50 to 1000 Angstroms.

13. The method of claim 11, wherein said doped polysilicon layer, used for said doped polysilicon plug, is obtained using LPCVD procedures, to a thickness between about 1000 to 6000 Angstroms, and doped in situ, during deposition, via the addition of arsine or phosphine, to a silane ambient, resulting in a bulk concentration between, of said doped polysilicon layer, between about 1E19 to 2E20 atoms/cm$^3$.

14. The method of claim 11, wherein said thick insulator layer is a silicon oxide layer, obtained using LPCVD or PECVD procedures, to a thickness between about 4000 to 20000 Angstroms.

15. The method of claim 11, wherein said insulator shapes are formed from said thick insulator layer, via an anisotropic RIE procedure, using $CHF_3$ as an etchant.

16. The method of claim 11, wherein said first undoped amorphous silicon layer is deposited using LPCVD procedures, to a thickness less than 200 Angstroms, using silane, or disilane, as a source.

17. The method of claim 11, wherein said lightly doped amorphous silicon layer is deposited using LPCVD procedures, to a thickness less than 400 Angstroms, and doped in situ, during deposition, via the addition of phosphine to a silane, or to a disilane ambient, resulting in a bulk concentration for said lightly doped amorphous silicon layer, between about 1E19 to 4E20 atoms/cm$^3$.

18. The method of claim 11, wherein said second undoped amorphous silicon layer is obtained using LPCVD procedures, to a thickness less than 200 Angstroms, using silane, or disilane, as a source.

19. The method of claim 11, wherein said heavily doped amorphous silicon layer is obtained using LPCVD procedures, to a thickness between about 100 to 1000 Angstroms, and doped in situ, during deposition, via the addition of phosphine to a silane, or to a disilane ambient, resulting in a bulk concentration for said heavily doped amorphous silicon layer, greater than 4E20 atoms/cm$^3$.

20. The method of claim 11, wherein the removal of said insulator shapes is accomplished using a buffered hydrofluoric acid solution.

21. The method of claim 11, wherein said HSG silicon seeds are formed via LPCVD, or UHVCVD procedures, at a temperature between about 550 to 800° C., at a pressure below 1.0 torr, and for a time between about 10 sec. to 120 min, using a silane, or a disilane flow, at a concentration below 1.00E–3 moles/m$^3$, in a nitrogen ambient.

22. The method of claim 11, wherein said first anneal cycle, used to form said HSG silicon layer, from said HSG silicon seeds, and from said undoped/lightly doped/undoped amorphous silicon layers, is performed at a temperature between about 550 to 800° C., at a pressure below 1.0 torr, for a time between about 0 to 120 min., in a nitrogen ambient.

23. The method of claim 11, wherein said second anneal cycle, used to convert said HSG silicon layer, to said highly doped HSG silicon layer, and to establish said crown shaped storage node electrode, is performed at a temperature between about 800 to 850° C., for a time between about 20 to 60 min.

* * * * *

UNITED STATES PATENT AND TRADEMARK OFFICE
CERTIFICATE OF CORRECTION

PATENT NO. : 5,913,119
DATED : 06/15/99
INVENTOR(S) : Dahcheng Lin, Jung-Ho Chang, Hsi-Chuan Chen It is certified that error appears in the above-identified patent and that said Letters Patent is hereby corrected as shown below:

On the Cover Page, delete item (76), and replace with
(75) Inventors: Dahcheng Lin, Hsinchu; Jung-Ho Chang, Uen-Lin; Hsi-Chuan Chen, Tainan, all of Taiwan.

Add (73) Assignee: Vanguard International Semiconductor Corporation. Hsin-Chu, Taiwan Signed and Sealed this Nineteenth Day of December, 2000

Attest:

Q. TODD DICKINSON

Attesting Officer

Commissioner of Patents and Trademarks